(12) United States Patent
Chen et al.

(10) Patent No.: US 6,881,648 B2
(45) Date of Patent: Apr. 19, 2005

(54) SEMICONDUCTOR WAFER HAVING A THIN DIE AND TETHERS AND METHODS OF MAKING THE SAME

(75) Inventors: Shiuh-Hui Steven Chen, Lake Zurich, IL (US); Raymond Garza, Huntley, IL (US); Carl Ross, Mundelein, IL (US); Stefan Turalski, Chicago, IL (US)

(73) Assignee: Motorola, Inc., Schaumburg, IL (US)

( * ) Notice: Subject to any disclaimer, the term of this patent is extended or adjusted under 35 U.S.C. 154(b) by 144 days.

(21) Appl. No.: 10/387,754

(22) Filed: Mar. 13, 2003

(65) Prior Publication Data

US 2003/0162322 A1 Aug. 28, 2003

Related U.S. Application Data

(62) Division of application No. 10/058,557, filed on Jan. 28, 2002, now Pat. No. 6,608,370.

(51) Int. Cl.[7] .............................................. H01L 21/46
(52) U.S. Cl. ..................... 438/459; 438/455; 438/456; 438/977
(58) Field of Search ................................ 438/459, 455, 438/456, 977

(56) References Cited

U.S. PATENT DOCUMENTS

| | | |
|---|---|---|
| 3,761,784 A | 9/1973 | Jund |
| 4,191,057 A | 3/1980 | Busta |
| 4,275,406 A | 6/1981 | Muller et al. |
| 4,317,126 A | 2/1982 | Gragg, Jr. |
| 4,395,451 A | 7/1983 | Althouse |
| 4,444,054 A | 4/1984 | Schaff, Jr. |
| 4,667,944 A | 5/1987 | Althouse |
| 4,670,969 A * | 6/1987 | Yamada et al. ............... 438/53 |
| 4,683,755 A | 8/1987 | Samek |
| 4,711,014 A | 12/1987 | Althouse |

(Continued)

OTHER PUBLICATIONS

"Micromachines on the March" Janusz Bryzek, Kurt Petersen, and Wendell McCulley. IEEE Spectur, May 1994, pp 20–31.

"Ultra Thin ICs Open New Dimensions for Microelectric Systems" G. Klink, C. Landesberger, M. Feil, F. Ansorge, R. Aschenbrenner. Advancing Microelectronics, Jul./Aug. 2000; pp. 23–25.

"New Process Scheme for Wafer Thinning and Stress–free Seperation of Ultra Thin ICs" C. Landesberger, S. Scherbaum, G. Schwinn, H. Spohrie. Proceedings of Microsystems Technologies 2001; pp. 1–7.

(Continued)

Primary Examiner—Carl Whitehead, Jr.
Assistant Examiner—James Mitchell
(74) Attorney, Agent, or Firm—Thomas V. Miller; Brian M. Mancini

(57) ABSTRACT

A semiconductor wafer (70) that includes a support body (72), at least one thin die (20, 60), and a plurality of tethers (78, 178). The support body (72) is made of a semiconductor material. The thin die (20, 60) has a circuit (21) formed thereon and has an outer perimeter (74) defined by an open trench (76). The open trench (76) separates the thin die (20, 60) from the support body (72). The tethers (78, 178) extend across the open trench (76) and between the support body (72) and the thin die (20, 60). A method of making a thin die (20, 60) on a wafer (70) where the wafer (70) has a support body (72), a topside (82) and a backside (90). A circuit (21) is formed on the topside (82) of the wafer (70). The method may include the steps of: forming a cavity (88) on the backside (90) of the wafer (70) beneath the circuit (21) that defines a first layer (92) that includes the circuit (21); forming a trench (76) around the circuit (21) on the topside (82) of the wafer (70) that defines an outer perimeter (74) of the thin die (20, 60); forming a plurality of tethers (78, 178) that extend across the trench (76) and between the wafer support body (72) and the thin die (20, 60); and removing a portion of the first layer (92) to define the bottom surface (75) of the thin die (20, 60).

19 Claims, 8 Drawing Sheets

U.S. PATENT DOCUMENTS

| | | | | |
|---|---|---|---|---|
| 4,802,952 A | * | 2/1989 | Kobori et al. | 438/51 |
| 4,986,861 A | | 1/1991 | Nishida et al. | |
| 4,996,627 A | | 2/1991 | Zias et al. | |
| 5,338,284 A | * | 8/1994 | Knelson | 494/28 |
| 5,356,176 A | | 10/1994 | Wells | |
| 5,472,085 A | | 12/1995 | Gelzer | |
| 5,591,679 A | * | 1/1997 | Jakobsen et al. | 438/51 |
| 5,629,486 A | | 5/1997 | Viduya et al. | |
| 5,644,102 A | | 7/1997 | Rostoker | |
| 5,917,264 A | | 6/1999 | Maruno et al. | |
| 6,179,127 B1 | | 1/2001 | Kato et al. | |
| 6,357,594 B1 | | 3/2002 | Gutentag | |
| 6,446,818 B1 | * | 9/2002 | Dubey et al. | 211/41.18 |
| 6,535,492 B1 | * | 3/2003 | Shtivelman | 370/270 |
| 6,777,680 B1 | * | 8/2004 | Morita et al. | 250/338.1 |
| 2004/0074285 A1 | * | 4/2004 | Dimeo et al. | 73/31.05 |

OTHER PUBLICATIONS

"Innovative Packaging Concepts for Ultra Thin Integrated Circuits" G. Klink, M. Fell, F. Ansorge, R. Aschenbrenner, H. Reichl. Electonic Components and Technology Conference, 2001; pp. 1034–1039.

"Thin Silicon Chips and ACF Connection Technology for Contactless IC Cards" Mitsuo Usami. 1999 International Symposium on Microelectronics; pp. 309–312.

"Mechanical Lapping, Handling and Transfer of Ultra–Thin Wafers" S. Pinel, J. Tasselli, J.P. Bailbe, A. Marty, P. Puech and D. Esteve. Microengineering vol. 8, 1998; pp 338–342.

"SmartCard Assembly Requires Advanced pre–Assembly Methods" Dr. J. Muller, P. Stampka, W. Kruninger, E. Gaulhofer, H. Oyrer. Semiconductor Internationall, Jul. 2000; pp. 191–200.

"Thin Monocrystalline Silicon Films on Flexible Substrates Enable Multiple Transfer Processes" C. berge, Dr. R. Bergmann, D. J. Werner. MRS Bulletin, Aug. 2001; pp. 603.

Khazan, A.D., "Transductors and Their Elements: Design and Application." Prentice–Hall, Inc. 1994, ISBN 03–13–929480–5. pp 393–395.

"Packaging Very High Pressure Transducers for Common Rail Diesel Injection Systems" K. Sidhu, Measurement Specialties, Inc. Oct. 1987, pp. 1–4.

* cited by examiner

SEMICONDUCTOR WAFER HAVING A THIN DIE AND TETHERS AND METHODS OF MAKING THE SAME

CROSS-REFERENCE TO RELATED APPLICATION

This application is a divisional of U.S. Ser. No. 10/058,557, filed on Jan. 28, 2002, entitled "SEMICONDUCTOR WAFER HAVING A THIN DIE AND TETHERS AND METHODS OF MAKING THE SAME," by Shiuh-Hui Steven Chen, Raymond Garza, Carl Ross, and Stefan Turalski, (U.S. Pat. No. 6,608,370) which is hereby incorporated by reference herein in its entirety.

This application is related to the following co-pending and commonly assigned patent application, which is hereby incorporated by reference herein: application Ser. No. 10/058,650, entitled "METHOD OF SEPARATING AND HANDLING A THIN SEMICONDUCTOR DIE ON A WAFER," filed on same date herewith, by Shiuh-Hui Steven Chen, Cheryl Field, Didier R. Lefebvre, and Joe Pin Wang.

FIELD OF THE INVENTION

This invention in general relates to the making and handling of a very thin semiconductor die and, more particularly, to an improved device and procedure for fabricating, separating and transporting very thin dice for better throughput and yield.

BACKGROUND OF THE INVENTION

As technology progresses, integrated circuits are being formed on smaller and thinner semiconductor dice for a variety of applications. Relatively thin integrated circuits (ICs) or semiconductor dice, also known as "ultra-thin" or "super-thin" ICs or dice, are used in applications such as smart cards, smart labels, sensors, and actuators. A thin die for sensors is described in pending application Ser. No. 09/629,270, filed on Jul. 31, 2000, entitled "Strain Gauge" by Shiuh-Hui Steven Chen, et al., incorporated herein by reference in its entirety. There, a relatively thin semiconductor die with piezo-resistors act to measure the pressure of fluids in vehicles. The thin semiconductor die is bonded to a stainless steel port in order to measure diaphragm deformation.

For smart card applications, the thickness of the die may be as low as 100 micrometers ($\mu$m). In the future, it is anticipated that an even smaller thickness will be necessary. For sensors, a thin die may have a thickness of between 5 and 50 $\mu$m as described in application Ser. No. 09/629,270.

When making and handling a very thin semiconductor die, care must be taken not to fracture or otherwise damage the die. Currently, a need exists for improved methods and procedures to fabricate, separate, and transport a thin die for high volume applications where automated techniques are required to produce high throughput and acceptable yields.

It is known to separate and handle integrated circuits on thin semiconductor die by mechanical grinding, chemical etching and dry etching with the assistance of adhesive or UV related release tapes and carrier wafers. Some of the approaches taken in the electronics industry to separate thin wafers into dice and handle thin dice include dicing by cutting and dicing by thinning. In dicing by cutting, a dicing tape is mounted on frames. The wafers are mounted to the dicing tape, backside down. Dicing is carried out by sawing, laser cutting, dry etch, etc. After cutting, the dice are separated on the dicing tape and sent to the assembly line on a wafer frame for pick and place. The thin die is then ejected from the backside of the tape with the help of an ejector pin and picked by a vacuum tip. An example of this process flow is described in Muller et al., "Smart Card Assembly Requires Advanced Pre-Assembly Methods," SEMICONDUCTOR INTERNATIONAL (July 2000) 191.

In dicing by thinning, trenches are etched or sawed on the topside of a device wafer. Laminating tapes are then placed on a carrier wafer for mounting the carrier wafer to the topside of the device wafer. The bottom side of the device wafer is then thinned until the topside trenches are opened from the bottom side. A second carrier wafer is then mounted to the bottom side of the device wafer by a high-temperature release tape. The first carrier wafer is removed and then the thin dice can be removed by locally heating a vacuum-picking tool. An example of this process flow requiring multiple carrier wafers and tape transfers is described in C. Landesberger et al., "New Process Scheme for Wafer Thinning and Stress-Free Separation of Ultra Thin ICs," published at MICROSYSTEMS TECHNOLOGIES, MESAGO, Dusseldorf, Germany (2001).

Alternatively, it has been known to saw or cut a carrier wafer into carrier chips, each of them carrying a thin die. In this case, the carrier chip is removed after die bonding by thermal release of the adhesive tape. An example of this process flow is described in Pinel et al., "Mechanical Lapping, Handling and Transfer of Ultra-Thin Wafers," JOURNAL OF MICROMECHANICS AND MICROENGINEERING, Vol. 8, No. 4 (1998) 338.

Conventional procedures have been met with a varying degree of success. The combination of carrier transfers and tape transfers necessitate multiple steps with long cycle times and yield loss. Moreover, the use of heat release and other tapes may exhibit unacceptable residual adhesion. Further, when used in combination with an ejector pin, the edges may not delaminate from the tape due to the lack of flexural rigidity of the thin die and due to the die's small size in the in-plane directions. The small size of the die may also limit the net suction force that could be exerted by the vacuum tip to overcome residual tape adhesion. With regard to conventional dicing and wafer sawing methods, these steps often result in damage to the thin die that causes device failure or performance degradation. Conventional ejector pins may exert excessive stress that damages the thin die, also causing cracking and device failure. Carrier transfer or tape transfer may lead to die contamination on both sides of the die. Multiple transfers by wafer carriers typically lead to lower yield due to increased handling and contamination. In the case of a very thin die for sensor applications, organic adhesive may leave residue on the die surface, causing poor bonding with the surface being measured.

It is, therefore, desirable to provide an improved device and method of fabricating, separating and handling very thin dice to overcome most, if not all, of the preceding problems.

Figure 1:
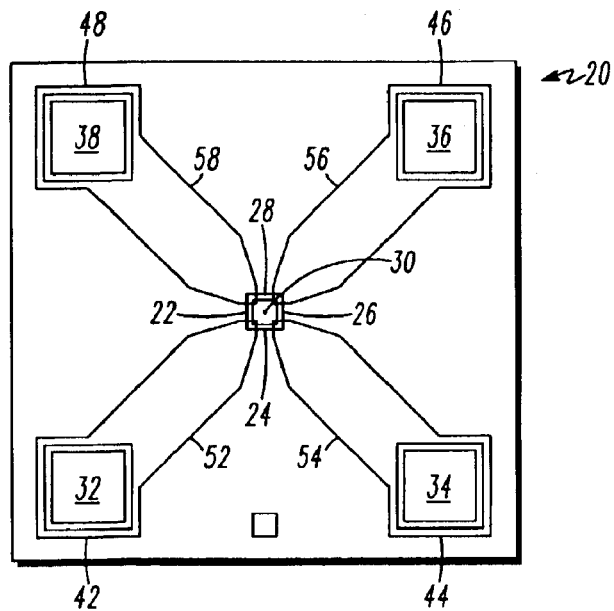
FIG. 1 is an enlarged view of one embodiment of a thin semiconductor-sensing die with an array of strain gauges positioned in a Wheatstone bridge arrangement.

While the invention is susceptible to various modifications and alternative forms, specific embodiments have been shown by way of example in the drawings and will be described in detail herein. However, it should be understood that the invention is not intended to be limited to the particular forms disclosed. Rather, the invention is to cover all modifications, equivalents and alternatives falling within the spirit and scope of the invention as defined by the appended claims.

DETAILED DESCRIPTION

What is described is an improved device and method of making and handling a thin semiconductor die including the fabrication, separation and transfer of such die. For purposes of illustration and description, an example of an application of a thin semiconductor die is described below in the context of a thin semiconductor-sensing die for sensing the pressure of fluids in a vehicle. However, the present invention is not limited to the making and handling of dice for sensors but may also apply to other thin dice applications such as smart cards, smart labels, actuators, and multi-thin wafer designs. One of ordinary skill in the art having the benefit of this disclosure will realize that the devices and procedures described herein for the making and handling of thin dice could be used in other semiconductor applications.

To this end, in one embodiment there is a semiconductor wafer that includes a support body, at least one thin die, and a plurality of tethers. The support body is made of a semiconductor material. The thin die has a circuit formed thereon and has an outer perimeter defined by an open trench. The open trench separates the thin die from the support body. The tethers extend across the open trench and between the support body and the thin die.

The support body may have a first thickness and the thin die may have a second thickness, wherein the second thickness is substantially less than the first thickness. In one embodiment, the tethers may be substantially triangular in shape but other shapes may be used such as substantially rectangular, elliptical, semi-circular, or square. It is preferred that the portion of the tether that extends across the open trench has its smallest width adjacent to the outer perimeter of the thin die. This provides a cohesive failure point (or break point) of the tether to be along the outer perimeter of the thin die to prevent any residual overhangs during subsequent pick and place operations. Moreover, this cohesive failure point should mean that the tether itself breaks rather than being peeled from the thin die. The tether may also be patterned such that at least a portion of a groove or hole extends into the portion of the tether that goes across the open trench. The tethers may be made of a material such as a polyimide although other materials may be used to support the thin die to the support body.

In another embodiment, there is a method of making a thin die on a wafer where the wafer has a support body, a topside and a backside. A circuit is formed on the topside of the wafer. The method may include the steps of: forming a cavity on the backside of the wafer beneath the circuit that defines a first layer that includes the circuit; forming a trench around the circuit on the topside of the wafer that defines an outer perimeter of the thin die; forming a plurality of tethers that extend across the trench and between the wafer support body and the thin die; and removing a portion of the first layer to define the bottom surface of the thin die.

In another embodiment, there is a method of forming tethers on a wafer to retain a thin die to a support body of the wafer. The wafer has a topside and a backside. The thin die is positioned adjacent to the topside of the wafer. The method may include the steps of: forming a cavity on the backside of the wafer beneath the thin die that defines a first layer that includes the thin die; forming a trench around the thin die on the topside of the wafer that defines an outer perimeter of the thin die and extends between the thin die and the support body; patterning a polyimide material on the top surface of the wafer to define the tethers, the tethers extending across the trench and between the thin die and the support body; and removing a portion of the first layer to expose the trench such that the tethers provide the attachment between the thin die and the support body.

Now, turning to the drawings, an example use of thin semiconductor dice will be explained and then a wafer with a thin die and tethers along with a method of separating and handling the thin die will be explained.

Example Use of Thin Semiconductor Dice

For purposes of illustration and description, a thin semiconductor die will be explained in the context of sensors for measuring the pressure of fluids in a vehicle. Such a thin die for sensors is described in detail in pending application Ser. No. 09/629,270, filed on Jul. 31, 2000, entitled "Strain Gauge" by Shiuh-Hui Steven Chen, et al., incorporated herein by reference in its entirety.

An example of a thin semiconductor die is shown in FIG. 1. The thin semiconductor die 20 in this example is a die for a sensor that measures the pressure of fluids in vehicles and may range from 5 to 50 micrometers ($\mu$m) thick. The die 20 has sufficient structural strength and integrity to support one or more strain gauges 22, 24, 26, 28. In this case, the die 20 is generally square and has a geometric center 30. Metal bond pads 32, 34, 36, 38 are positioned in proximity and adjacent to the corners of the die 20. A set, series, or array of silicon oxide openings providing electrical contacts 42, 44, 46, 48 are disposed and securely positioned underneath the pads 32, 34, 36, 38. The die 20 has semiconductors 52, 54, 56, 58 (such as P+ doped silicon-containing interconnects) that provide interconnects between the strain gauges 22, 24, 26, 28 and the electrical contacts 42, 44, 46, 48.

Figure 3:
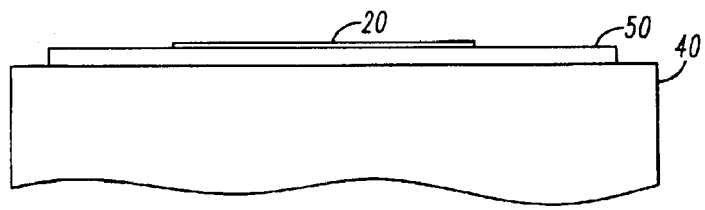
FIG. 3 is a side view of a thin semiconductor-sensing die mounted on a diaphragm.

The die 20 illustrated in FIG. 1 has strain gauges 22, 24, 26, 28 with interconnected resistors positioned in a Wheatstone bridge arrangement. The gauges 22, 24, 26, 28 measure strain in response to and induced by pressure of a fluid, such as fluid in a vehicle. Accordingly, referring to FIG. 3, the thin semiconductor-sensing die 20 may be mounted to a fluid responsive diaphragm 40. The thin semiconductor-sensing die 20 and fluid responsive diaphragm 40, and how it may interconnect with a fluid housing, is further described in application Ser. No. 09/629,270, filed on Jul. 31, 2000, entitled "Strain Gauge" by Shiuh-Hui Steven Chen, et al. In sum, the fluid responsive diaphragm 40 can be positioned to contact the sensed fluid in the vehicle. These fluid responsive diaphragms are preferably made of a corrosion-resistant material (such as stainless steel) that will not readily corrode in the fluid being sensed.

A symmetrical pressure-conductive coupling 50 can be provided to connect the semiconductor die to the diaphragm. The coupling 50 may include a corrosive-resistant pressure-conductive electrically insulating material to conduct and transmit the sensed pressure from the diaphragm to the thin semiconductor-sensing die 20. A suitable coupling 50 is made of fused glass frit and screen-printed on the diaphragm 40. Glass frit is useful because it electrically isolates and prevents shorts from the metal diaphragm 40.

Figure 2:
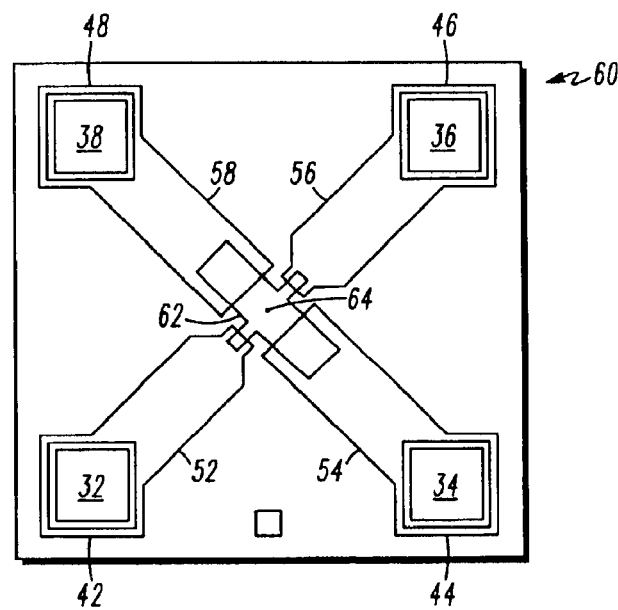
FIG. 2 is an enlarged view of another embodiment of a thin semiconductor-sensing die with a single transverse strain gauge.

Another embodiment of a thin semiconductor-sensing die 60 is shown in FIG. 2. The thin semiconductor-sensing die 60 as shown in FIG. 2 is structurally and functionally similar to the one shown in FIG. 1 but has a single transverse strain gauge 62. The single transverse strain gauge 62 is registered and positioned in alignment with the geometrical center 64 of the die 60. This helps minimize electrical effects of thermal stress on the transverse strain gauge during measuring and operation of the vehicle. Here, the transverse strain gauge can include a single four contact resistor element oriented to maximize response to pressure induced stresses through shear stress effects. A further description of the thin semiconductor sensing die 60 and strain gauge 62 are provided in application Ser. No. 09/629,270, filed on Jul. 31, 2000, entitled "Strain Gauge" by Shiuh-Hui Steven Chen, et al., incorporated herein by reference in its entirety.

As with other thin semiconductor dice, there is a continuing need to improve the separation and handling of a thin die after fabricating the integrated circuit thereon. In particular, there is an ongoing need to increase throughput in a low cost automated environment and to provide better yields in such an environment.

Wafer with Thin Die and Tethers

A new device and process has been developed to assist in separating a thin semiconductor die from a wafer. An integrated circuit 21 is initially formed on a standard wafer. Further fabrication processes to help in subsequent separation of a die (that includes the circuit) from the wafer are illustrated in the top views of FIGS. 4 and 5 and in the cross-sectional views of FIGS. 6A–6D. The device and process includes the formation of thin tethers around the perimeter of the die. This allows for easier separation of the die from the wafer in subsequent processes. Again, for purposes of illustration, the description and figures are shown in the context of the thin semiconductor die 20 described above in FIG. 1. One of ordinary skill in the art with the benefit of this disclosure will recognize, however, that the present invention applies to other thin die applications.

Figure 4:
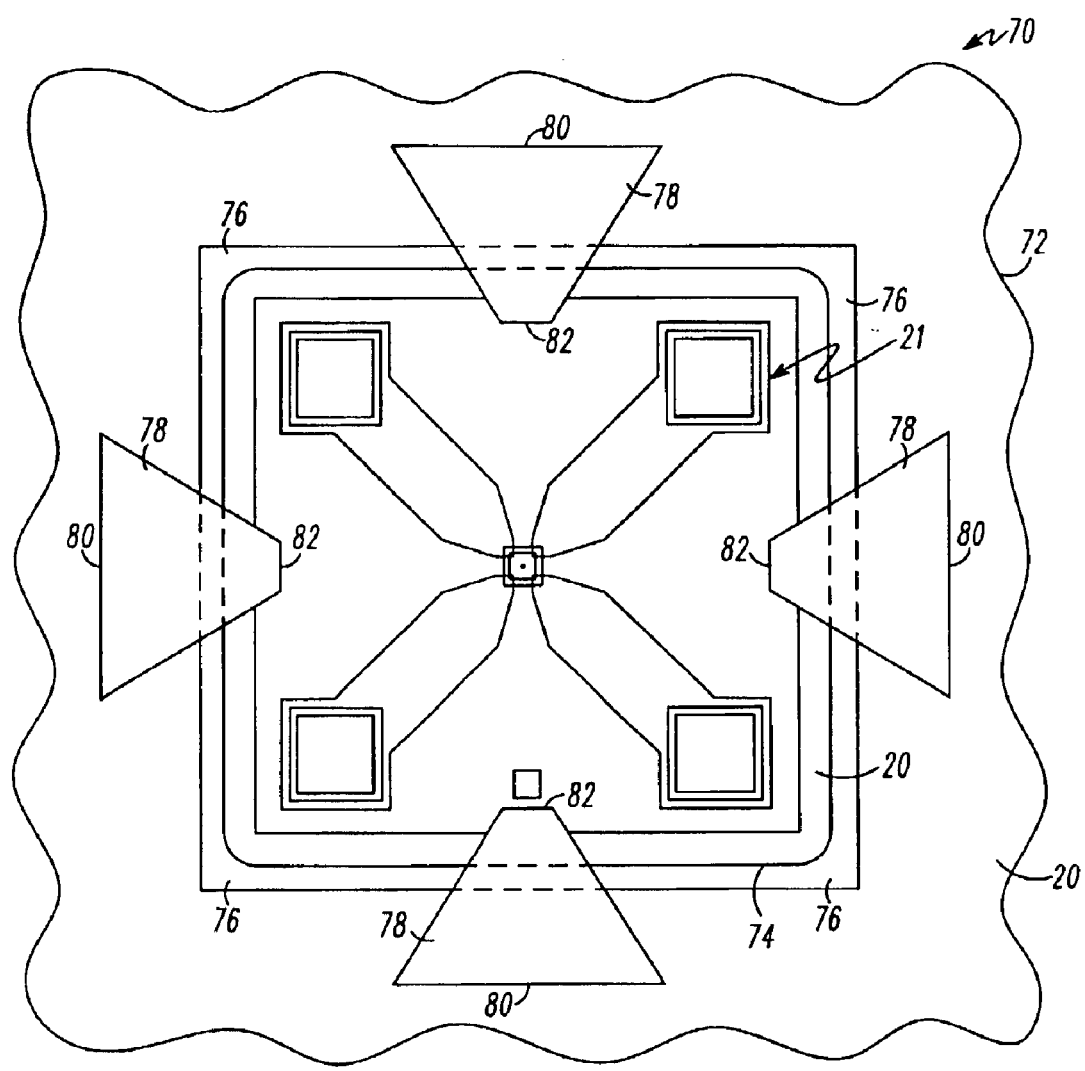
FIG. 4 is an exploded partial top view of one embodiment of a wafer having a thin die with tethers.

Referring to FIG. 4, an exploded portion of a semiconductor wafer 70 is shown having a support body 72 made of a semiconductor material and at least one thin semiconductor die 20. The thin die 20 has an integrated circuit (generally referenced as 21) formed thereon. The thin die 20 also has an outer perimeter 74 defined by an open trench 76. The open trench 76 separates the thin die 20 from the support body 72 of the wafer 70. A plurality of support tethers 78 extend across the open trench 76 and between the support body 72 and the thin die 20. In one embodiment, as will be seen in the cross-sectional views of FIGS. 6A–6D, the thickness of the thin die 20 is substantially less than the thickness of the support body 72.

The tethers 78 may have a variety of geometric patterns and sizes. In one embodiment, as shown in FIG. 4, the tethers 78 may be substantially triangular. Here, the substantially triangular tethers 78 have a base 80 that is formed on the topside 82 of the wafer 70 and a tip 82 that extends across the open trench 76 and onto the die 20. The tip 82 of the tether 78 may be patterned so that it is partially cutoff to limit the portion of the tether 78 extending on the die 20. The tether 78 should, however, extend sufficiently onto the die 20 to allow the die 20 to be retained to the wafer support body 72. This attachment should be sufficient to withstand normal shipping and handling requirements for a standard wafer. In one embodiment, for a die 20 having a thickness of about 15 $\mu$m, each of the tethers extend at least 10 $\mu$m over the outer perimeter 74 of the die 20.

Figure 5:
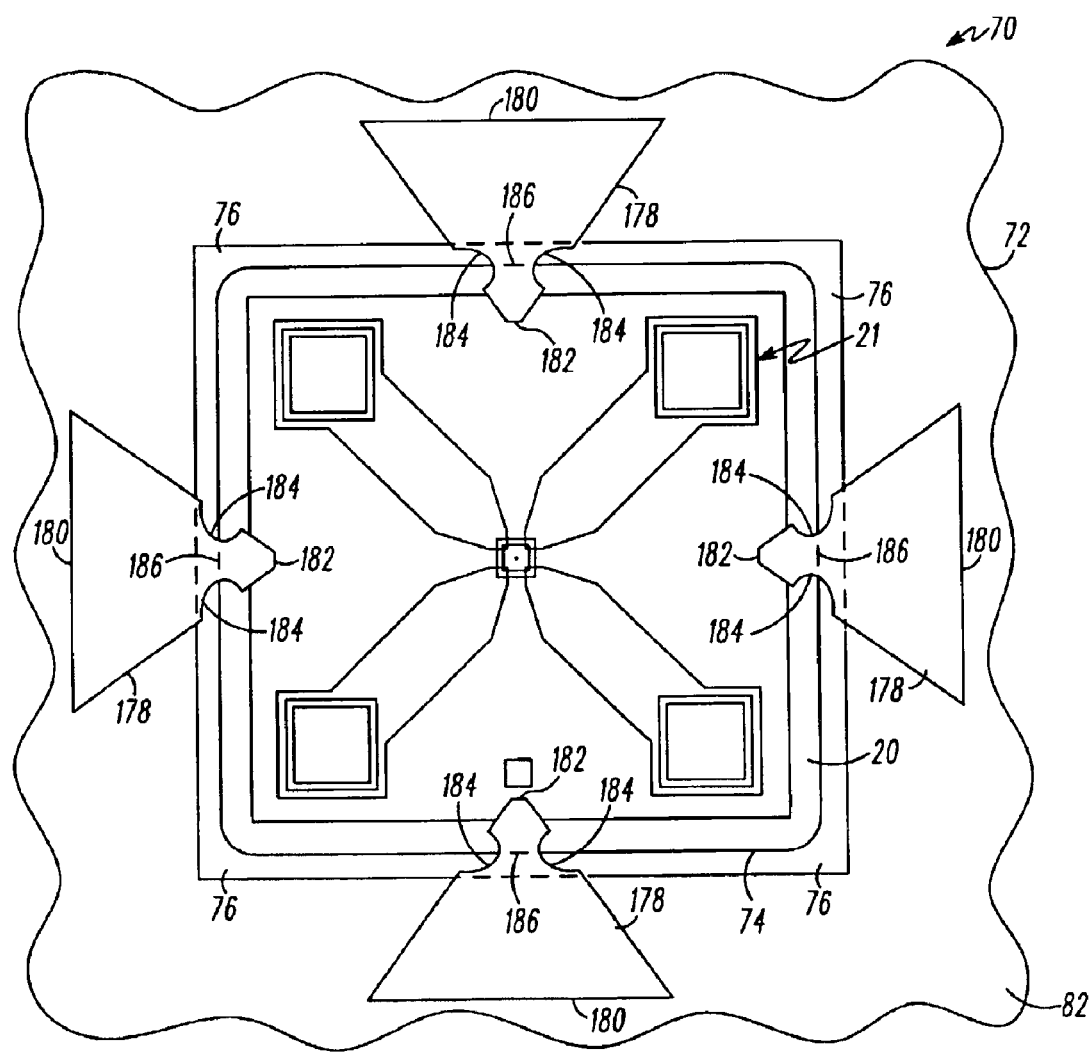
FIG. 5 is an exploded partial top view of another embodiment of a wafer having a thin die with tethers.

In another embodiment, as shown in FIG. 5, a tether 178 is also substantially triangular but is patterned with grooves 184. The substantially triangular tethers 178 have a base 180 that is formed on the topside 82 of the wafer 70 and a tip 182 that extends across the open trench 76 and onto the die 20. The grooves 184 are at least partially formed in the portion of the tether 178 that extends over the trench 76. The grooves 184 define a neck 186 that extends between the two grooves 184. The benefit of including grooves 84 in the formation of the tethers 178 is that they allow for better separation of the die 20 from the wafer 70 during pick and place operations. Although the specific width of the neck 186 is application specific, in one embodiment for a thin die 20 having a thickness of about 15 $\mu$m, the width of the neck 186 may have ranges between 10 and 40 $\mu$m. What is important is that a cohesive failure point (or break point) of the tethers 178 be along the edge of the semiconductor die and such that the tether itself breaks rather than being peeled from the thin die during pick and place operations. This break point should be sufficiently wide to withstand normal shipping and handling requirements for a standard wafer—yet be sufficiently thin to break along the outer perimeter of the die 20 during pick and place operations. As shown in FIGS. 4 and 5, in a preferred embodiment, the portion of the tethers 78, 178 extending across the open groove 76 has its smallest width adjacent to the outer perimeter 74 of the die 20. This permits the break point to be right at the outer perimeter 74 to limit any overhang of the tether that may result after die separation.

Although FIGS. 4 and 5 show substantially triangular tethers, the tethers may also be of other exotic geometric shapes such as substantially rectangular, elliptical, semicircular, or square. Additionally, to provide better break points above trench 76, the grooves 184 in the tethers 178 may be replaced with holes or slots in the tethers 78 along the trench 76. Depending on the geometric shape of the tether, the addition of grooves, holes or slots may enable the tethers to have a better cohesive failure point along the outer perimeter 74 of the semiconductor die 20.

Figure 6A:
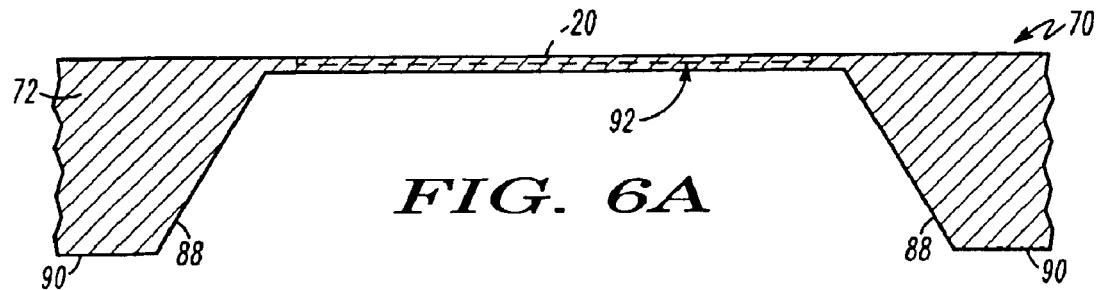
FIGS. 6A–6D are cross-sectional views of a process to form tethers that extend between a support body and a thin die of a wafer.

A process for making or forming the tethers 78, 178 for a thin die 20 on a wafer 70 will now be explained. Referring now to FIG. 6A, after forming the circuit on the die 20 on the topside 82 of the wafer 70, the process includes the step of forming a cavity 88 on a backside 90 of the wafer 70 (beneath the circuit on the die 20). This backside cavity 88 defines a thin layer 92 that includes the circuit on the die 20. The backside cavity 88 will also define the wafer support body 72 that is substantially thicker than the thin layer 92 and the die 20. The thin layer 92 has a thickness slightly greater than the die 20.

The cavity 88 on the backside 90 of the wafer 70 may be formed using known semiconductor etching methods. In one embodiment, the cavity 88 is formed using an anisotropic wet etch using chemical solutions such as KOH, EDP or TMAH. A masking material (not shown) such as silicon dioxide or silicon nitride may be used for etching the cavity 88. The depth of the cavity 88 on the backside 90 of the wafer 70 is application specific and will depend on the desired thickness of the die 20. In one example, where the desired thickness of the die 20 is to be about 15 µm, etching may be performed for sufficient time to define the thin layer 92 to a thickness of about 22 µm.

Figure 6B:
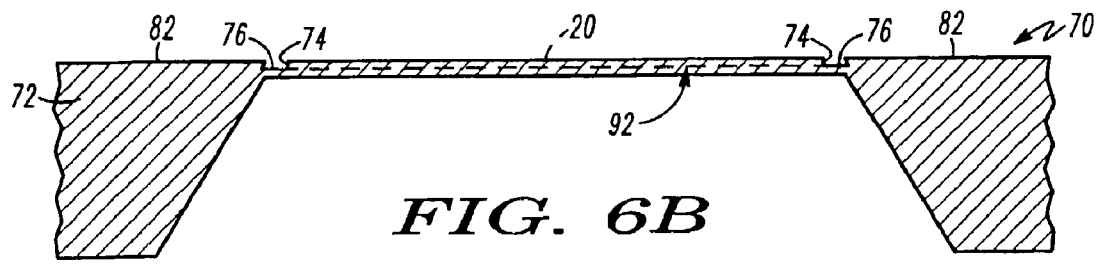

As shown in FIG. 6B, the next step is the formation of a trench 76 around the circuit on the topside 82 of the wafer 70. As mentioned above, the trench 76 will define the outer perimeter 74 of the die 20 having a circuit. The trench 76 may be formed using known semiconductor etching methods. In one embodiment, the trench 76 is formed using an etch process such as reactive ion etching (RIE), plasma etching or sputter etching. The depth of the trench 76 is application specific and will depend on the desired thickness of the die 20 and the thickness of the thin layer 92. The trench 76 should have a depth of at least the desired thickness of the die 20 but smaller than the thickness of the thin layer 92 illustrated in FIG. 6A. In the above example where the desired thickness of the die 20 is to be about 15 µm and the thin layer 92 is about 22 µm, the trench 76 may be formed to about 18 µm deep.

Figure 6C:
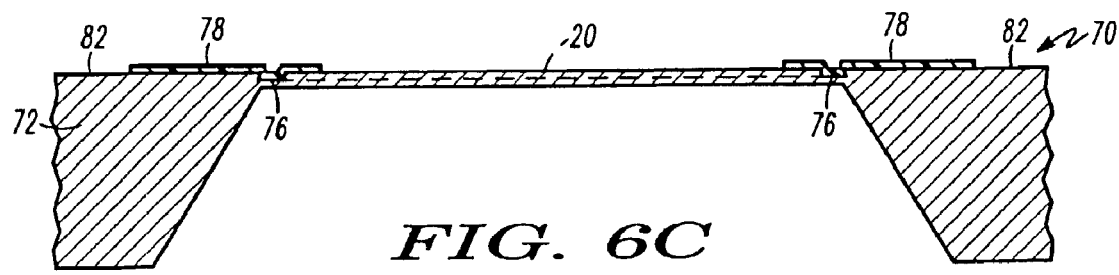

As shown in FIG. 6C, the process also includes a step of forming tethers 78 on the topside 82 of the wafer 70. The tethers 78 also extend across and into select portions of the trench 76 and between the wafer support body 72 and the die 20. The tethers 78 should be patterned. As described above, FIGS. 4 and 5 show top views of some embodiments of patterned tethers 78, 178. Note that FIG. 6C uses the reference number for the tethers 78 in FIG. 4. However, the view shown in FIG. 6C would apply equally to the tethers 178 shown in FIG. 5 and even for other geometric shapes of tethers. What is critical is that the tethers form a bridge or other connection between the support body 72 and the thin die 20 of the wafer 70.

In one embodiment, the tethers 78 are made of a polyimide material although other materials may be used such as other thermoplastic materials or polymers. A polyimide material is preferred because it can have a thickness ranging from a few microns to tens of microns. Although the thickness of the tether may be application specific, in one embodiment, a polyimide tether may be between 2–10 µm on the topside 82 of the wafer 70 and 5–30 µm in the trench 76. The polyimide coating is preferably applied to the wafer 70 using a spin coating process. Although a spin coating process provides good uniformity and coating qualities, other known application techniques could be used such as spray, drop coating, and roller.

To perform the patterning, a photosensitive polyimide may be used. Existing photosensitive polyimides permit the patterning of relatively fine features. The patterning process may include spin coating the polyimide and a drying step by hot plates or an oven. In combination with a negative tone photo mask, the deposited photosensitive polyimide layer may then be exposed to a standard I or G lithography tool. The patterned polyimide tethers may then be cured by conventional methods. Curing the polyimide film involves the removal of the solvent carrier or other volatiles from the polyimide layer and the hardening of the polymer into suitable tethers.

If a photosensitive polyimide is not used, other methods of patterning may be used such as conventional wet or dry etching processes. A wet etching process will typically include that the polyimide be patterned prior to final cure. A dry etching processing may also include that the polyimide be patterned prior to final cure.

Figure 6D:
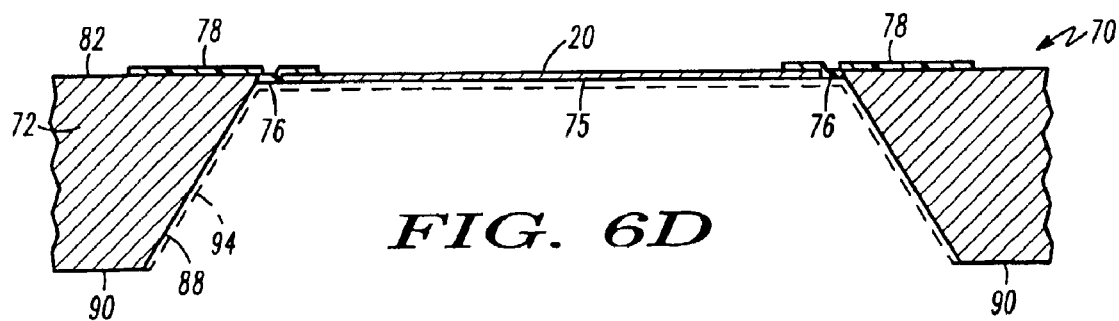

As shown in FIG. 6D, the next step is to remove a thin layer 94 on the backside 90 of the wafer 70. The removed thin layer 94 is shown in FIG. 6D as a dashed line below the thin die 20 and along the widened cavity 88. The removal of the thin layer 94 exposes the trench 76 but leaves the tethers 78 intact. In effect, the removal of the thin layer 94 removes a portion of the thin layer 92 shown in FIG. 6A to define a bottom surface 75 of the die 20. The thin layer 94 may be removed using a variety of conventional etching methods such as reactive ion etching (RIE), plasma etching or sputter etching. The depth of the removed thin layer 94 is application specific and will depend on the desired thickness of the die 20, the thickness of the initial thin layer 92, and the depth of the trench 76. As explained above, the removed thin layer 94 should have a depth sufficient to expose the trench 76 but not as deep to remove the tethers 78. In the above example where the desired thickness of the die 20 is to be about 15 µm, the initial thin layer 92 being about 22 µm, and the trench 76 being about 18 µm, the removed thin layer 94 has a depth of about 7 µm deep.

It can be seen in the figures that the thin semiconductor die 20 is still attached to the surrounding support body 72 of the wafer 70 by the tethers 78. The wafer 70 (having at least one die 20 and tethers 78) are now suitable for packing, shipping and transporting to assembly plants where the thin dice may be subsequent separated by breaking the tethers 78 by pick and place operations. These further operations are explained in more detail below. What has been described is a device and process that helps in subsequent wafer separation of thin dice. The structure of the wafer also makes it easier to ship and automate die pick and place operations. This process also allows the surfaces of the die to be maintained very clean prior to die attachment to other surfaces.

The above figures illustrate a thin die that is substantially square. It is noted that the present invention is not limited to thin dice that are substantially square. While a square die is illustrated, in some circumstances it may be desirable to use other geometrical shapes for the die. Moreover, although the procedures are described in the context of a silicon-based semiconductor material, the present invention may also apply to the formation of tethers on other types of semiconductor materials such as gallium arsenide (GaAs). One of ordinary skill in the art with the benefit of this application would realize that such other geometrical shapes and semiconductor materials could be used.

Separation and Handling of a Thin Die

As described above, the thin die 20 is suspended on the wafer 70 by thin tethers 78, 178 that can be made of a material such as polyimide. As will be illustrated below, the tethers allow a cohesive failure point that occurs along the outer perimeter 74 of the thin die 20 during subsequent pick and place operations. It is preferred that the individual tethers 78, 178 be small to minimize the amount of residual polyimide left on the area extending on the die 20. The number of tethers 78, 178 around the perimeter of the thin die 20 should be sufficient to ensure that the die 20 does not fall off during wafer handling and shipping. As described above, in one embodiment, the thin die 20 is attached to the wafer by four (4) tethers 78, 178, one tether 78, 178 for each side of the die 20.

An advantage of suspending a thin die 20 by tethers 78, 178 is that the die 20 is ready for pick and place operations without any further processing steps at the wafer level. Additionally, suspending the thin die 20 by use of tethers 78, 178 enables the backside of the die 20 to be more easily shielded from contaminants. As will be explained in more detail below, in one embodiment for a pressure sensor, the backside of the die 20 is the portion of the die 20 that is bonded or otherwise attached to a pressure port. This backside surface needs to be clean from contaminants for sensors.

Figure 7:
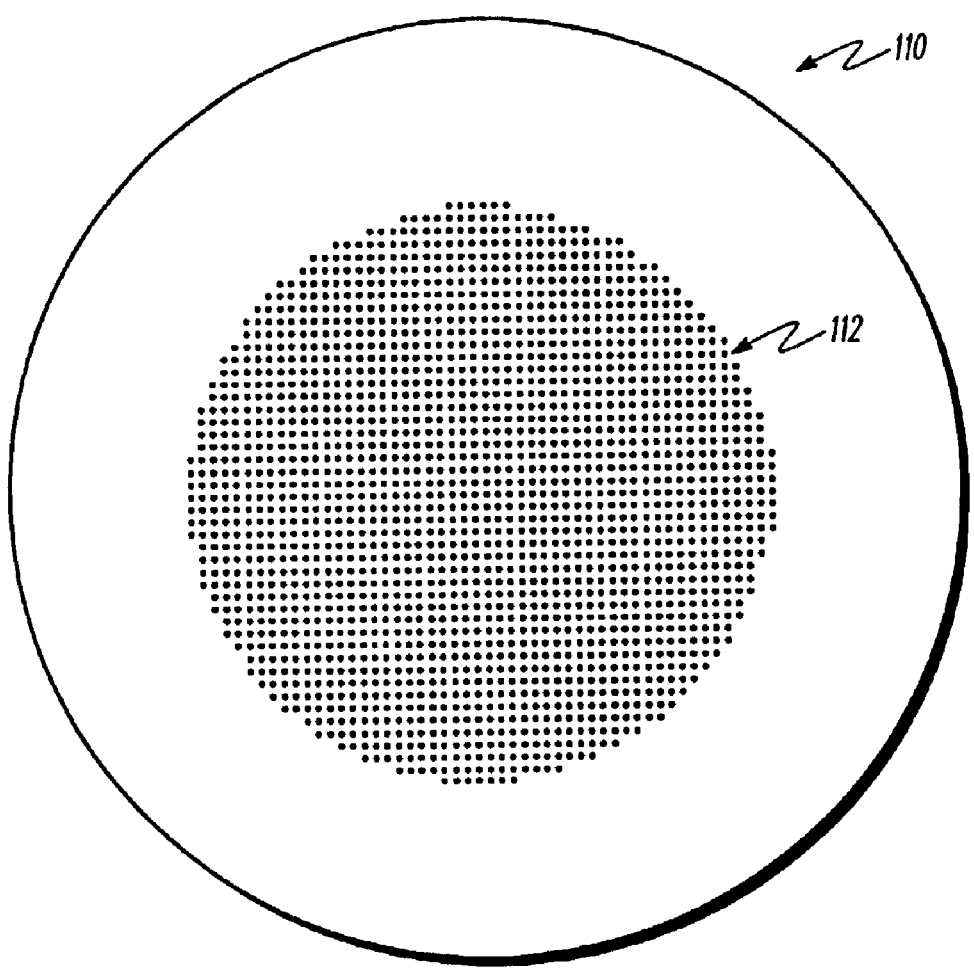
FIG. 7 is a top view of one embodiment of a rigid backing for a wafer of the present invention.
Figure 8:
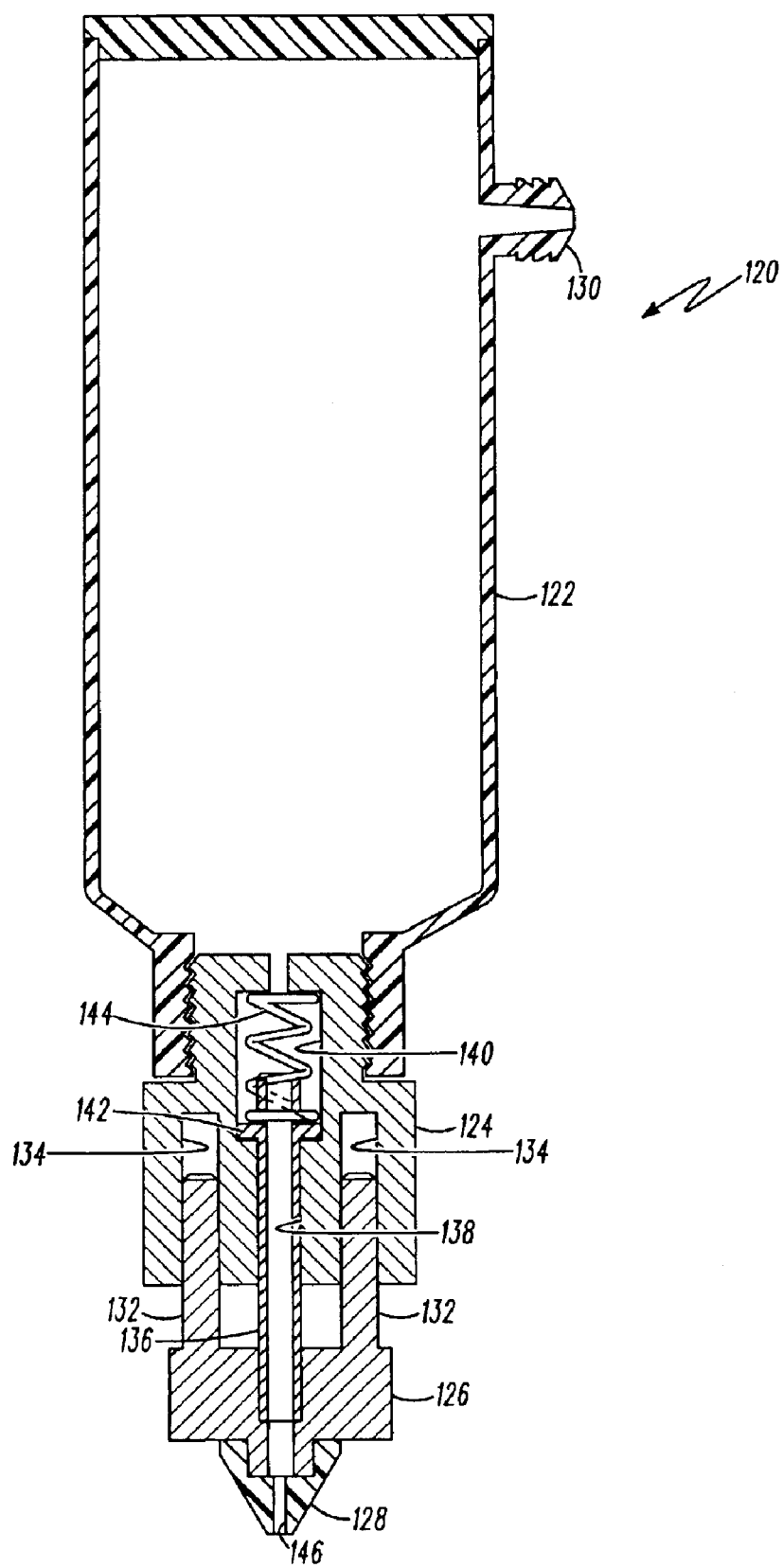
FIG. 8 is a cross-sectional view of one embodiment of a die handler for pick and place operations.
Figure 9A:
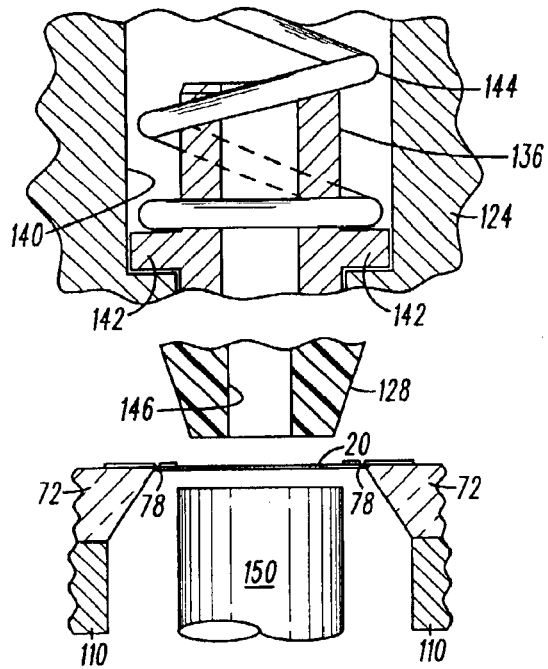
FIGS. 9A–9D are side views of one procedure of the present invention for separating and extracting a thin die from a wafer.
Figure 9B:
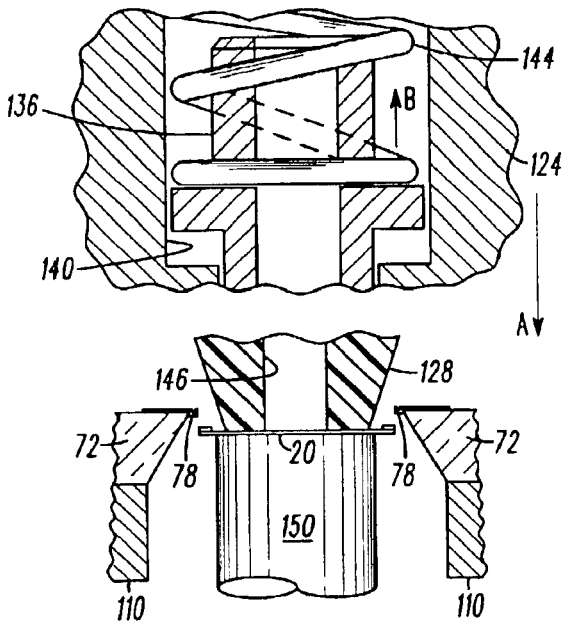
Figure 9C:
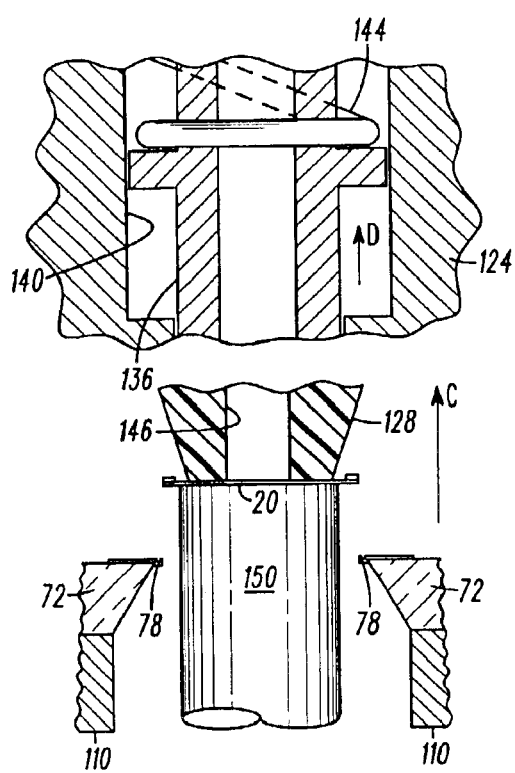
Figure 9D:
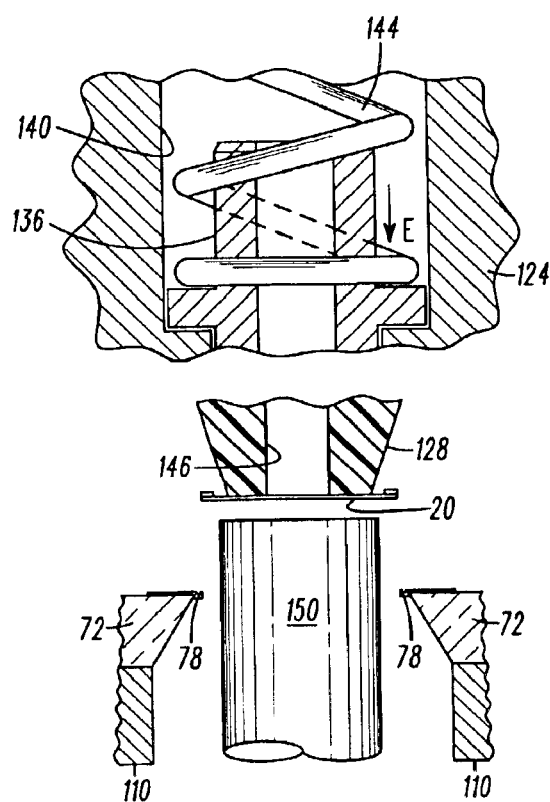
Figure 10A:
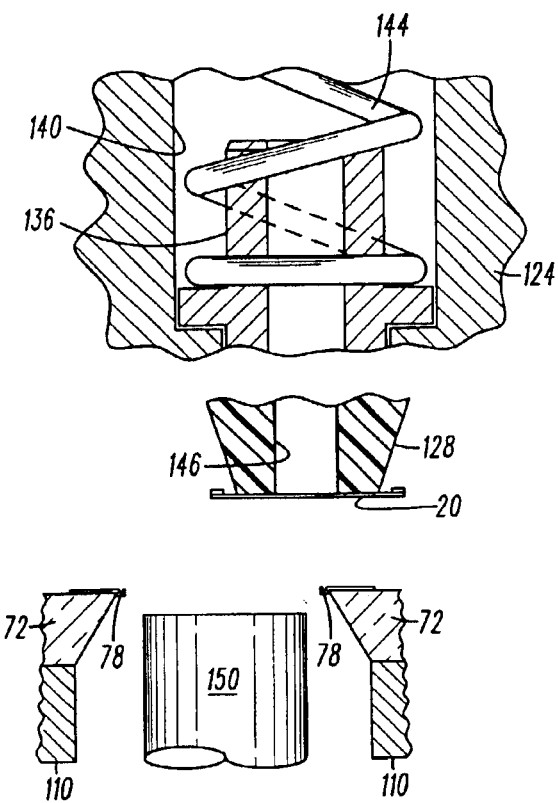
FIGS. 10A–10D are side views of one procedure of the present invention for transporting and installing a thin die on a surface.
Figure 10B:
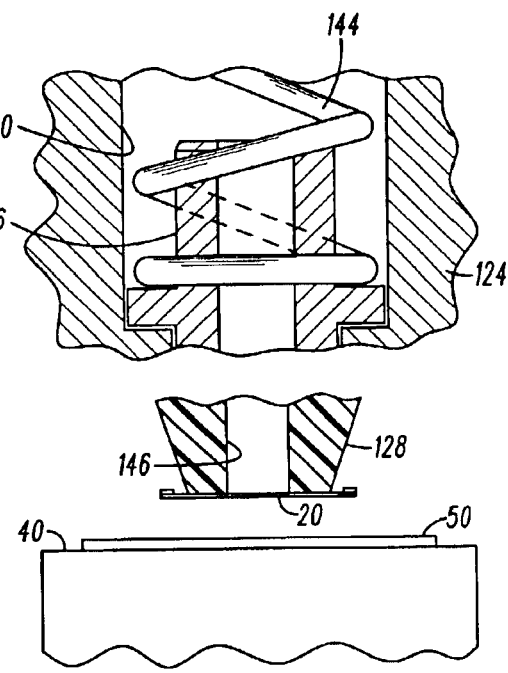

A new process for separating and handling thin die is illustrated in FIGS. 9A–9D and 10A–10D. FIGS. 9A–9D illustrate a process to remove or otherwise separate a thin die 20 from a wafer 70. FIGS. 10A–10B illustrate a process of transporting the thin die 20 from the wafer 70 and placing the die 20 on a surface or diaphragm 40. As illustrated in FIGS. 7 and 8, some of the tools used to perform these processes are a backing 110 and a die handler 120.

FIG. 7 shows one embodiment of a suitable backing 110. The backing 110 is preferably made of a metallic or other rigid material such as aluminum. During general wafer handling and die removal, the backing 110 is rigidly clamped, taped or otherwise attached to the wafer 70. The backing 110 has an array or plurality of holes 112. The holes 112 are spaced out to line up exactly with the plurality of backside cavities 88 that are formed on the wafer 70 described above in FIG. 6A. The contours of the backing 110 are shaped like standard wafer frames. This allows the backing 110 to fit inside standard feeders and machine fixtures. The use of a rigid backing 110 is important because the wafer 70 itself has very little flexural strength due to the numerous dice surrounded by square holes or trenches 76. The trenches 76 leave behind a thin wafer skeleton that may be subject to fracture without the use of the backing 110. Additionally, the trenches 76 have sharp corners that act as stress concentrators. The purpose of the backing 110 is to protect the wafer 70 against fracture during transporting and handling as well as during die removal. The holes 112 in the backing 110 allow an ejection pin (as shown in FIGS. 9A–9D) to move freely in and out of every backside cavity 88 of the wafer 70.

FIG. 8 shows one embodiment of a die handler 120. The die handler 120 is used for pick and place operations. Where the die 20 is used for a pressure sensor, the die handler 120 may also be used to remove or separate the die 20 from a wafer 70 and install the die 20 to a pressure port or diaphragm 40. In other applications, the die handler 120 may be used to remove or separate the die from the wafer and install the die to whatever other surface that the die is to be mounted. The die handler 120 may be attached to an automated machine to perform pick and place operations to each of the plurality of dice 20 on the wafer 70.

In one embodiment, as shown in FIG. 8, the die handler 120 may have an upper body chamber 122, a rigid body portion 124, a movable body portion 126, and a tip 128. The upper body chamber 122 is attached to the rigid body portion 124. As shown in FIG. 8, this may be done by threading the upper body chamber 122 to the rigid body portion 124. The upper body chamber 122 has a port 130 that is configured for receiving a line to a vacuum source (not shown). The upper body chamber 122 is preferably made of plastic but may be made of other materials such as metallic materials.

The movable body portion 126 is movably attached to the rigid body portion 124. In one embodiment, the movable body portion 126 has guide pins 132 that are capable of sliding within cylindrical chambers 134 of the rigid body portion 124. The movable body portion 126 is capable of moving up and down in relation to the rigid body portion 124. Between the movable body portion 126 and the rigid body portion 124 is a piston 136. The piston 136 is rigidly attached to the movable body portion 126 and movably attached to the rigid body portion 124 within cylindrical chambers 138 and 140. The piston 136 has a ridge 142 that allows the piston to be retained in the rigid body portion 124. A spring 144 is used within a cylindrical chamber 140 in the rigid body portion 124 to provide a compressive force to keep the piston 136 and movable body portion 126 in the downward position. The rigid body portion 124, the movable body portion 126, and the piston 136 are preferably made of a metallic material such as aluminum, although other materials may be used such as plastic.

The tip 128 is preferably made of a flexible material such as rubber. The tip 128 is attached to the movably body portion 126. As described and shown in FIG. 8, the spring 144 is configured to allow the tip 128 of the handler 120 to also move in relation to the rigid body portion 124.

As explained above, the port 130 in the upper body chamber 122 is configured for receiving a line to a vacuum source. A passageway 146 is provided through the rigid body portion 124, through the piston 136, through the movable body portion 126, and through the tip 128. As will be explained below, this passageway 146 provides a vacuum suction force that will assist in pick and place operations for the thin die 20.

Other configurations for a die handler 120 may be suitable for the present invention. For example, the guide pins 132 may be rigidly attached to the rigid body portion 124 and extend into cylindrical chambers in the movable body portion 126. Alternatively, the upper body chamber 122 may be removed and the port 130 (attached to the vacuum source) may be directly connected to the passageway 146 of the rigid body portion 124. In any event, what is important is that the die handler 120 has some flexibility when pressure is applied to the thin die 20 during pick and place operations. Some of those features may include fabricating the tip 128 out of a flexible material such as rubber. Alternatively, the die handler 120 could include a spring mechanism such as that described in relation to FIG. 8.

What will now be explained is a procedure for pick and place operations for separating and handling a thin die 20. Again, for purposes of illustration, the description and figures are shown in the context of the thin semiconductor die 20 described above in FIG. 1. One of ordinary skill in the art with the benefit of this disclosure will recognize, however, that the present invention applies to other thin die applications.

Referring to FIG. 9A–9D, a procedure for removing or separating the thin die 20 from the support body 72 of the wafer 70 will be explained. The thin die 20 is initially attached to the support body 72 by an attachment mechanism such as that described above having a plurality of tethers 78, 178. As illustrated in FIG. 9A, the wafer 70 (having a support body 72, at least one thin die 20, and tethers 78 (or 178)) is positioned on backing 110. One of the plurality of holes 112 is positioned beneath the thin die 20. The tip 128 of the die handler 120 is positioned above the thin die 20 on the wafer 70. Because no force is being exerted on the tip 128, the spring 144 within chamber 140 keeps the tip 128 in the downward position by forcing the ridge 142 of the piston 136 to the bottom of the cylindrical chamber 140 of the rigid body portion 124. The vacuum source connected to the port 130 is then activated providing a vacuum to passageway 146. An ejection pin 150 is also positioned in a spaced apart relationship beneath the thin die 20 and within a hole 112 of the backing 110.

Referring to FIG. 9B, the die handler 120 is then moved in the downward direction (as shown by arrow A) toward the thin die 20. The tip 128 of the die handler 120 makes contact with the thin die 20. The tip 128 of the die handler 120 continues in the downward direction A to break the tethers 78 (or 178). The rigid backing 110 holds the support body 72 of the wafer 70 in place. This separates the thin die 20 from the support body 72 of the wafer 70. The tip 128 of the die handler 120 continues in the downward direction A until it makes contact with the ejection pin 150. This clamps the thin die 20 between the tip 128 of the handler 120 and the ejection pin 150. It is noted that when the tip 128 of the die handler 120 travels in the downward direction A (to break the tethers and make contact with the ejection pin 150), the piston 136 is permitted to move within the chamber 140 in an upward direction (as shown by arrow B) to compress the spring 144. This provides a soft landing of the tip 128 when it comes in contact with the thin die 20 to prevent damage.

It is noted that the thin die 20 is detached from the wafer 70 by exerting a downward pressure. The application of a downward force is an important feature of the present invention. An alternative process such as pulling the thin die 20 up by relying solely on the suction force exerted by the passageway 146 within the tip 128 has proven to be unreliable. This is due to the fact that a very small contact area of the die 20 limits the suction force that can be exerted by the passageway 146 within the tip 128. Relying solely on the suction force to detach the die 20 would limit the tether design to being extremely weak. This would result in requiring tight process controls on tether manufacturing and would increase the risk of die separation during wafer handling and shipping. In contrast, relying on a compressive force (against the rigid backing 110) to break off the tether allows more flexibility in varying the tether design. It also allows more tolerance in variability in the tether fabrication process without compromising the ability to separate the die 20 from the wafer 70.

In the preferred embodiment, the vacuum source remains active through passageway 146 while the thin die 20 is detached from the wafer 70. If the vacuum is turned off, the thin die 20 may not be held horizontally during the breakage of the tethers. This may cause the tethers to break at different times. If the tethers do not break simultaneously, there is a risk that the last tether will fold and act as a hinge, leaving the thin die 20 hanging by one edge.

Referring to FIG. 9C, the tip 128 of the die handler 120 and ejection pin 150 move together in the upward direction (as shown by arrow C). This may further move the piston 136 within the chamber 140 in an upward direction (as shown by arrow D) to further compress the spring 144. It is noted that during this step the thin die 20 is preferably clamped between the tip 128 of the die handler 120 and the ejection pin 150. The clamped thin die 20 is then extracted from the support body 72 of the wafer 70 by a simultaneous upward motion in the upward direction C. Left unclamped, the thin die 20 may be lost during extraction, as the die 20 may come in contact with the residual tethers 78 (or 178) left hanging around the perimeter of the support body 72 of the wafer 70. Again, this is due to the fact that the net suction force exerted by the vacuum source through the passageway 146 within the tip 128 may not be strong enough to pull the thin chip 20 through any residual tethers left hanging around the perimeter of the support body 72 of the wafer 70.

Clamping the thin die 20 between the tip 128 and the ejection pin 150 also eliminates the possibility that the die 20 will shift or rotate before or during extraction. Such shifts or rotations could possibly cause the thin die 20 to collide with the support body 72 of the wafer 70. Additionally, to minimize bending or shearing, the ejection pin should have a diameter in close proximity to that of the tip 128 and its upper surface should be flat in relation to the thin die 20.

The die handler 120 and the ejection pin 150 may move together in an upward direction C to extract the thin die 20. Alternatively, having a spring 144 in the die handler 120, the die handler 120 could be programmed to be stationary while the ejection pin 150 provides the upward force. The spring 144 enables the ejection pin 150 to provide the upward force by allowing the tip 128 of the die handler 120 to move upward with the ejection pin 150.

Referring to FIG. 9D, the die handler 120 may be moved in the upward direction to lift the thin die 20 off the ejection pin 150. This will move the piston 136 within the chamber 140 of the die handler 120 in a downward direction (as shown by arrow E) by the compressive forces exerted by the spring 144. The ridge 142 of the piston 136 will then rest in the bottom of the chamber 140. With the vacuum source to the passageway 146 still active, the thin die 20 remains on the tip 128 of the die handler 120. The ejection pin 150 is now free to retract in it initial downward position.

As can be seen in the above-described separation and extraction process, the use of a spring-mounted compliant pick up head has several important advantages. First, the soft spring limits the force when the tip 128 makes initial contact with the thin die 20. Second, the soft spring limits the clamping force exerted on the thin die 20 when the thin die 20 is clamped between the tip 128 and the ejection pin 150. This reduces the risk of damage to the thin die 20. Third, the spring eliminates the need to synchronize the upward motions of the ejection pin 150 and the tip 128 of the die handler 120 as shown in FIG. 9C. If the tip 128 were rigid, synchronizing these two moving parts while controlling the clamping force would be difficult to achieve. Now, the tip 128 of the die handler 120 can be programmed to be stationary while the ejection pin 150 moves upward. Forth, the soft spring allows the die handler 120 to be operated in displacement control, without any need to monitor the clamping force. Finally, the soft spring loosens the requirements on the precision and accuracy of the stopping positions of both the tip 128 of the die handler 120 and the ejection pin 150.

Figure 10C:
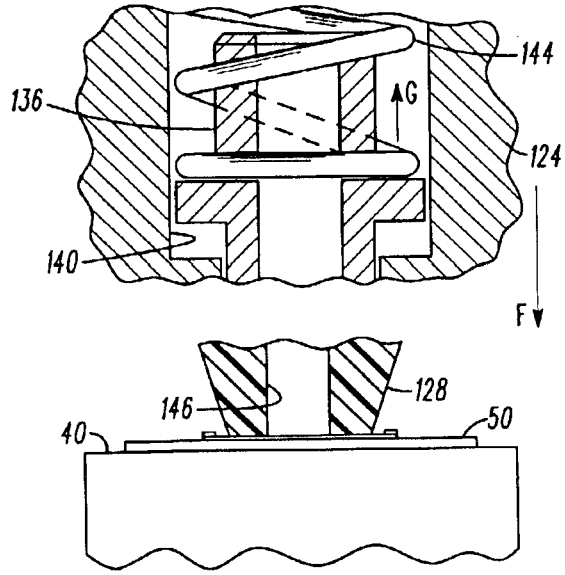

What will now be explained is a procedure for handling and installing a thin die 20 on a diaphragm 40. As illustrated in FIGS. 10A and 10B, the thin die 20 (attached to the tip 128 of the die handler 120) is moved from the support body 72 of the wafer 70 and positioned above a diaphragm 40. It is noted that during this handling procedure, the vacuum source attached to the passageway 146 within the tip 128 is active. As shown in FIG. 10C, the tip 128 of the die handler 120 is moved in the downward direction (as shown by arrow F) to place the thin die 20 to the diaphragm 40 via a coupling 50 (explained below). It is noted that when the thin die 20 and the tip 128 of the die handler 120 travels in the downward direction F (and make contact with the diaphragm 40 and coupling 50), the piston 136 is permitted to move within the chamber 140 in an upward direction (as shown by arrow G) to compress the spring 144. This provides a soft landing of the thin die 20 when it comes in contact with the coupling 50 and the diaphragm 40 to prevent damage.

As explained above, in the case of a thin die 20 for a pressure sensor, a pressure-conductive coupling 50 is used between the thin die 20 and the diaphragm 40. The coupling 50 may include a corrosive-resistant pressure-conductive electrically insulating material to conduct and transmit the sensed pressure from the diaphragm to the thin semiconductor-sensing die 20. A suitable coupling 50 is made of fused glass frit and screen-printed on the diaphragm 40. Glass flit is useful because it electrically isolates and prevents shorts from the metal diaphragm 40.

Figure 10D:
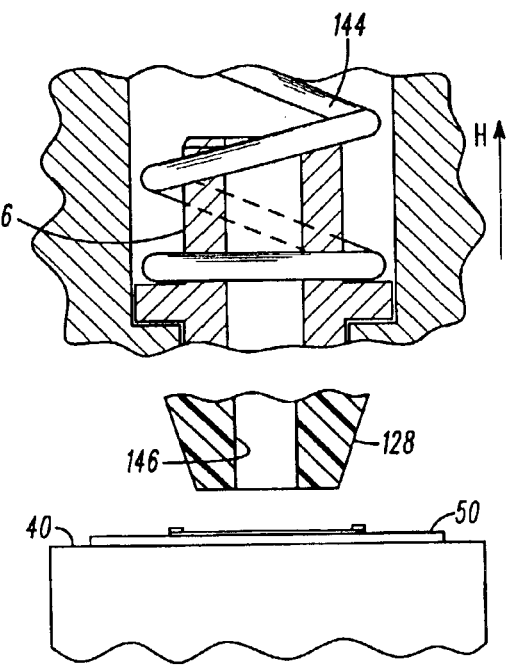

Referring to FIG. 10D, after the thin die 20 is placed on the diaphragm 40 via coupling 50, the die handler 120 is moved in the upward direction (as shown by arrow H). Prior to moving in the upward direction H, the vacuum source to the passageway 146 within the tip 128 is turned or switched off. This allows the tip 128 of the die handler 120 to separate from the thin die 20. The die handler 120 is now ready to perform its next pick and place operation on a new die on the wafer 70.

Although FIGS. 10A–10D show the handling and installing of a thin die 20 on a diaphragm 40, one of ordinary skill in the art having the benefit of this disclosure would realize that the same handling and installing steps may be taken to mount a thin die on other surfaces for other applications.

What has been described is a new device and process for separating and handling a thin die on a wafer. The present invention permits the separation of a thin die handled and shipped on the original wafer. The thin die can be separated or extracted directly from the original wafer used to form the integrated circuit on the die. Additional steps at the wafer level are avoided before the pick and place operations.

The above description of the present invention is intended to be exemplary only and is not intended to limit the scope of any patent issuing from this application. For example, the present discussion used a thin die for a sensor to describe the separation and handling of a thin die. The present invention is also applicable to separation and handling of other types of thin die such as applications for smart cards, smart labels, actuators, and multi-thin wafer designs. The present invention is intended to be limited only by the scope and spirit of the following claims.

What is claimed is:

1. A method of making a thin die on a wafer, the wafer having a support body, a topside and a backside, a circuit formed on the topside of the wafer, the method comprising the steps of:

forming a cavity on the backside of the wafer beneath the circuit that defines a first layer, the first layer includes the circuit;

forming a trench around the circuit on the topside of the wafer that defines an outer perimeter of the thin die;

forming a plurality of tethers that extend across the trench and between the wafer support body and the thin die, the tethers being made of a polyimide material; and removing a portion of the first layer to define the bottom surface of the thin die.

2. The method of claim 1, wherein the step of forming the cavity on the backside of the wafer includes wet etching the backside of the wafer.

3. The method of claim 1 wherein the step of forming the trench on the topside of the wafer includes reactive ion etching to form the trench.

4. The method of claim 1 wherein the step of forming of the tethers includes patterning the tethers so they are substantially triangular.

5. The method of claim 4 wherein the step of patterning the tethers so that they are substantially triangular further includes patterning the tethers so that they have a base and a tip, the base of each tether being attached to the support body of the wafer and the tip of each tether extending across the trench and attached to the thin die.

6. The method of claim 1 wherein the step of removing the portion of the first layer includes reactive ion etching the first layer.

7. The method of claim 1 wherein the step of forming the tethers includes forming a portion of each tether that extends across the trench to have its smallest width adjacent to the outer perimeter of the thin die.

8. The method of claim 1 wherein the step of forming the tethers includes forming a portion of each tether that extends across the trench to include at least a portion of a groove.

9. The method of claim 1 wherein the step of forming the tethers includes forming a portion of each tether that extends across the trench to include at least a portion of a hole.

10. A method of forming tethers on a wafer to retain a thin die to a support body of the wafer, the wafer having a topside and a backside, the thin die positioned adjacent to the topside of the wafer, the method comprising the steps of:

forming a cavity on the backside of the wafer beneath the thin die that defines a first layer, the first layer includes the thin die;

forming a trench around the thin die on the topside of the wafer that defines an outer perimeter of the thin die and extends between the thin die and the support body;

patterning a polyimide material on the top surface of the wafer to define the tethers, the tethers extending across the trench and between the thin die and the support body; and removing a portion of the first layer to expose the trench such that the tethers provide the attachment between the thin die and the support body.

11. The method of claim 10 wherein the step of patterning a polyimide material on the top surface of the wafer defines the tethers in a substantially triangular shape.

12. The method of claim 11 wherein the substantially triangular tethers have a base and a tip, the base of the tethers being attached to the support body of the wafer and the tip of the tethers extending across the trench and attached to the thin die.

13. The method of claim 10 wherein the step of forming the cavity on the backside of the wafer includes wet etching the backside of the wafer.

14. The method of claim 10 wherein the step of forming the trench around the thin die on the topside of the wafer includes reactive ion etching to form the trench.

15. The method of claim 10 wherein the tethers defined by the step of patterning a polyimide material on the top surface of the wafer include a portion of each tether that extends across the trench having its smallest width adjacent to the outer perimeter of the thin die.

16. The method of claim 10 wherein the tethers defined by the step of patterning a polyimide material on the top surface of the wafer include a groove in a portion of each tether that extends across the trench.

17. The method of claim 10 wherein the tethers defined by the step of patterning a polyimide material on the top surface of the wafer include a hole in a portion of each tether that extends across the trench.

18. A method of forming tethers on a wafer to retain a thin die to a support body of the wafer, the wafer having a topside and a backside, the thin die positioned adjacent to the topside of the wafer, the method comprising the steps of:

forming a cavity on the backside of the wafer beneath the thin die that defines a first layer, the first layer includes the thin die;

forming a trench around the thin die on the topside of the wafer that defines an outer perimeter of the thin die and extends between the thin die and the support body;

forming a plurality of tethers on the top surface of the wafer that extend across the trench and between the support body and the thin die, the tethers being made of a polyimide material; and removing a portion of the first layer to expose the trench such that the tethers provide the attachment between the thin die and the support body.

19. The method of claim 18 wherein the step of forming a plurality of tethers on the top surface of the wafer defines the tethers in a substantially triangular shape.

* * * * *